(12) United States Patent
Nam et al.

(10) Patent No.: US 11,978,798 B2
(45) Date of Patent: May 7, 2024

(54) SEMICONDUCTOR DEVICE

(71) Applicant: Samsung Electronics Co., Ltd., Suwon-si (KR)

(72) Inventors: Seunggeol Nam, Suwon-si (KR); Jinseong Heo, Seoul (KR); Sangwook Kim, Seongnam-si (KR); Hagyoul Bae, Hanam-si (KR); Taehwan Moon, Suwon-si (KR); Yunseong Lee, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 111 days.

(21) Appl. No.: 17/515,984

(22) Filed: Nov. 1, 2021

(65) Prior Publication Data
US 2022/0140148 A1 May 5, 2022

(30) Foreign Application Priority Data

Nov. 4, 2020 (KR) .................. 10-2020-0146372
Jun. 9, 2021 (KR) .................. 10-2021-0074978

(51) Int. Cl.
| | | |
|---|---|---|
| *H01L 29/78* | (2006.01) | |
| *H01L 29/08* | (2006.01) | |
| *H01L 29/51* | (2006.01) | |
| *H01L 29/786* | (2006.01) | |
| *H01L 29/06* | (2006.01) | |
| *H01L 29/423* | (2006.01) | |

(52) U.S. Cl.
CPC .... *H01L 29/78391* (2014.09); *H01L 29/0847* (2013.01); *H01L 29/516* (2013.01); *H01L 29/7851* (2013.01); *H01L 29/78696* (2013.01); *H01L 29/0673* (2013.01); *H01L 29/42392* (2013.01)

(58) Field of Classification Search
None
See application file for complete search history.

(56) References Cited

U.S. PATENT DOCUMENTS

| | | | |
|---|---|---|---|
| 9,093,492 B2 | 7/2015 | Tsai et al. | |
| 10,522,564 B2 | 12/2019 | Yoo | |
| 2005/0174842 A1* | 8/2005 | Bertin | G11C 23/00 365/185.03 |
| 2009/0057737 A1 | 3/2009 | Boescke et al. | |
| 2009/0261395 A1 | 10/2009 | Boescke | |
| 2010/0140589 A1* | 6/2010 | Ionescu | H01L 29/78391 257/295 |
| 2017/0162250 A1 | 6/2017 | Slesazeck et al. | |
| 2018/0294359 A1* | 10/2018 | Chen | H01L 29/7881 |
| 2019/0131420 A1* | 5/2019 | Lu | H01L 29/40111 |
| 2019/0198617 A1* | 6/2019 | Li | H01L 29/78642 |

FOREIGN PATENT DOCUMENTS

KR 102099896 B1 4/2020

* cited by examiner

Primary Examiner — Xiaoming Liu
(74) Attorney, Agent, or Firm — HARNESS, DICKEY & PIERCE, P.L.C.

(57) ABSTRACT

Provided is a ferroelectric semiconductor device including a source and a drain having different polarities. The ferroelectric semiconductor may include a ferroelectric including zirconium oxide ($ZrO_2$), hafnium oxide ($HfO_2$), and/or hafnium-zirconium oxide ($Hf_xZr_{1-x}O$, $0<x<1$). The semiconductor device may have memory-like characteristics.

20 Claims, 18 Drawing Sheets

SEMICONDUCTOR DEVICE

CROSS-REFERENCE TO RELATED APPLICATIONS

This application is based on and claims priority under 35 U.S.C. § 119 to Korean Patent Application Nos. 10-2020-0146372, filed on Nov. 4, 2020, and 10-2021-0074978, filed on Jun. 9, 2021, in the Korean Intellectual Property Office, the disclosures of which are incorporated by reference herein in their entirety.

BACKGROUND

1. Field

The present disclosure relates to a semiconductor device comprising a ferroelectric.

2. Description of the Related Art

Ferroelectrics are materials that exhibit ferroelectricity. Ferroelectricity is the ability of such materials to have a spontaneous polarization that can be maintained even in the absence of an external electric field applied thereto, by aligning internal electric dipole moments. The polarization (or an electric field) in ferroelectrics remains semi-permanent even after a voltage applied thereto reaches 0 V. Research has been conducted to improve the performance of semiconductor devices by applying this feature of ferroelectrics to semiconductor devices. For example, research has been conducted to apply ferroelectrics to memory devices, such as the feature of ferroelectrics in which polarization exhibits hysteresis with respect to the variation of voltage.

In addition, recently, research results have been presented on the possibility that a ferroelectric may have a negative capacitance in a specific region, and, when the ferroelectric is applied to a transistor, the subthreshold swing may be lowered to 60 mV/dec or less, which is a theoretical limit value of existing silicon-based transistors. In addition, research has been conducted on the use of ferroelectrics in low-power consumption semiconductor devices.

Also, since it has been found that hafnium-based oxides have ferroelectricity, research has been conducted on the use of hafnium-based oxides in semiconductor devices. Hafnium-based oxides have ferroelectricity even in a significantly thin film, having a thickness of several nanometers, and may be compatible with respect to a semiconductor process, and thus may be expected to be useful for miniaturizing a semiconductor device.

SUMMARY

An embodiment relates to a ferroelectric semiconductor device having excellent memory switching characteristics.

Another embodiment relates to a ferroelectric semiconductor device including a source and a drain having different polarities.

Additional aspects will be set forth in part in the description which follows and, in part, will be apparent from the description, or may be learned by practice of the presented embodiments of the disclosure.

According to an embodiment, a semiconductor device may include: a substrate including a source and a drain, and a channel between the source and the drain; a gate electrode above the substrate; and a ferroelectric between the substrate and the gate electrode. The source and the drain may have different polarities.

In some embodiments, one of the source and the drain may include a p-type doping material, and the other may include an n-type doping material. The concentration of the doping material of each of the source and drain may be greater than $1 \times 10^{19}/cm^3$.

In some embodiments, the channel may include a substrate that does not have a polarity, or may include a substrate material as a base material and may include a p-type or n-type doping material. The concentration of the doping material of the channel may be less than that of the source and/or the drain, and may be $1 \times 10^{19}/cm^3$ or less.

In some embodiments, the ferroelectric may include one or more selected from the group consisting of zirconium oxide ($ZrO_2$), hafnium oxide ($HfO_2$), and hafnium-zirconium oxide ($Hf_xZr_{1-x}O_2$, $0<x<1$). In addition, the ferroelectric may include a base material and a dopant material. The base material may include one or more selected from the group consisting of zirconium oxide ($ZrO_2$), hafnium oxide ($HfO_2$), and hafnium-zirconium oxide ($Hf_xZr_{1-x}O$, $0<x<1$). The dopant material may include one or more materials selected from the group consisting of C, Si, Ge, Sn, Pb, Al, Y, La, Gd, Mg, Ca, Sr Ba, Ti, Zr, and Hf. The content of the dopant material may be greater than 0 at % and less than or equal to 10 at %, with respect to metal elements of the base material.

In some embodiments, the substrate may include one or more selected from the group consisting of Si, Ge, SiGe, and a group III-V semiconductor. In addition, the substrate may further include an insulating material below the channel.

In some embodiments, the semiconductor device may further include a dielectric layer between the substrate and the ferroelectric. The dielectric layer may include a paraelectric material or a high-k dielectric material, and may include aluminum oxide ($Al_2O_3$), lanthanum oxide ($La_2O_3$, yttrium oxide ($Y_2O_3$), silicon oxide ($SiO_2$), or the like.

In some embodiments, the semiconductor device may further include a conductive layer between the substrate and the ferroelectric.

In some embodiments, a region of the substrate between the source and the drain may not include a doping material.

In some embodiments, a region of the substrate between the source and the drain may be doped to have a same polarity as a polarity of the source or the drain, and a concentration of a doping material in the region of the substrate between the source and the drain may be less than a dopant concentration the source or a dopant concentration in the drain. The concentration of the doping material in the region between the source and the drain may be $1 \times 10^{19}/cm^3$ or less.

In some embodiments, a thickness of the ferroelectric may be greater than 0 nm and less than or equal to about 20 nm.

In some embodiments, the semiconductor device may have memory-like characteristics.

A difference between a programming time and an erase time of the semiconductor device may be small. For example, the ratio of the erase time to the programming time may be about 0.8 to about 5.0. In addition, both the programming time and the erase time of the semiconductor device may be 1200 ns or less.

In some embodiments, an electronic device may include the semiconductor device.

According to an embodiment, a semiconductor device may include: a channel including a first side, a second side opposite the first side, and a first surface extending between the first side and the second side; a source connected to the first side of the channel; a drain connected to the second side of the channel, the source and the drain being doped to have different polarities from each other; a gate electrode facing the first surface of the channel; and a ferroelectric between the gate electrode and the first surface of the channel.

In some embodiments, the source and the drain may be doped regions in a substrate, and the channel may be a portion of the substrate between the source and the drain.

In some embodiments, the semiconductor device may further include a dielectric layer between the channel and the ferroelectric.

In some embodiments, the semiconductor device may further include a conductive layer between the substrate and the ferroelectric.

In some embodiments, the ferroelectric may include one of zirconium oxide ($ZrO_2$), hafnium oxide ($HfO_2$), and hafnium-zirconium oxide ($Hf_xZr_{1-x}O_2$, $0<x<1$).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
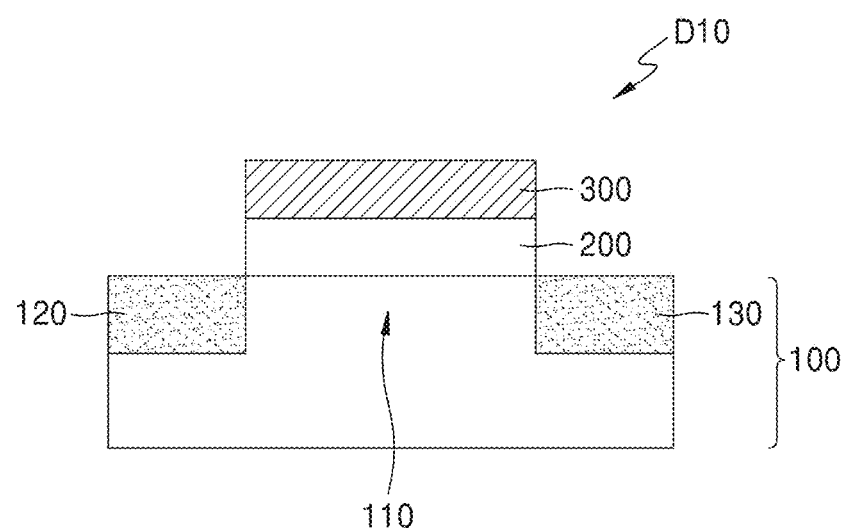
FIGS. 1 and 2 are schematic diagrams illustrating semiconductor devices according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is only for the purpose of describing particular embodiments and is not intended to be limiting of the spirit of the present disclosure. An expression "above" or "on" used herein may include not only "in contact with and directly above, below, left, and right" but also "in non-contact with and directly above, below, left, and right".

The singular expression also includes the plural meaning as long as it does not inconsistent with the context. It should be understood that the terms "comprises" and/or "includes" specify the presence of stated features, numbers, operations, elements, components, ingredients, materials and/or combinations thereof, but do not preclude the presence or addition of one or more other features, numbers, operations, elements, components, ingredients, materials and/or combinations thereof.

Although the terms such as "first", "second", and "third" may be used herein to describe various elements, these terms are only used to distinguish one element from another element, and the order and types of the elements should not be limited by these terms. Also, the terms such as "unit", "member", "module", " . . . er (or)", etc., denote a unit of a comprehensive configuration for processing at least one function or operation, and may be implemented as hardware or software or a combination of hardware and software.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described in detail with reference to the accompanying drawings. In the following drawings, like reference numerals refer to like elements, and the size (the width, thickness, or the like of a layer, a region, etc.) of each element may be exaggerated for clarity and convenience of description. Meanwhile, embodiments described below are merely illustrative, and various modifications may be made from these embodiments.

According to an aspect, a semiconductor device including a ferroelectric and an electronic device including the same may be provided. The semiconductor device may be a memory device and may be used in various electronic devices. These electronic devices may have advantages in terms of efficiency, speed, and power consumption compared to existing electronic devices.

FIG. 1 is a schematic diagram schematically illustrating a semiconductor device D10. Referring to FIG. 1, the semiconductor device D10 includes a substrate 100 including a source 120 and a drain 130, a gate electrode 300 above the substrate 100, and a ferroelectric 200 between the substrate 100 and the gate electrode 300. The semiconductor device may have memory-like characteristics.

The substrate 100 may include a semiconductor material. For example, the substrate 100 may include Si, Ge, SiGe, a group III-V semiconductor, or the like.

The substrate 100 may include the source 120 and the drain 130, and may include a channel 110 electrically connected to the source 120 and the drain 130. In other words, the source 120 may be electrically connected to or in contact with one end of the channel 110, and the drain 130 may be electrically connected to or in contact with the other end of the channel 110. For example, the channel 110 may be defined as a substrate region between the source 120 and the drain 130 in the substrate 100.

The gate electrode 300 may be above the substrate 100 to be spaced apart from the substrate 100, and may face the channel 110. The gate electrode 300 may have a conductivity of about 1 Mohm/square or less. The gate electrode 300 may include one or more selected from the group consisting of a metal, a metal nitride, a metal carbide, polysilicon, and combinations thereof. For example, the metal may include aluminum (Al), tungsten (W), molybdenum (Mo), titanium (Ti), or tantalum (Ta), the metal nitride may include a titanium nitride film (TiN film) or a tantalum nitride film (TaN film), and the metal carbide may be an aluminum or silicon-doped (or -containing) metal carbide and may include, for example, TiAlC, TaAlC, TiSiC, or TaSiC. The gate electrode 300 may have a structure in which a plurality of materials are stacked. For example, the gate electrode 300 may have a stack structure of a metal nitride layer/a metal layer such as TiN/Al or a stack structure of a metal nitride layer/a metal carbide layer/a metal layer such as TiN/TiAlC/W. The gate electrode 300 may include a titanium nitride (TiN) film or molybdenum (Mo), and the above example may be variously modified.

The ferroelectric 200 may be between the substrate 100 and the gate electrode 300. For example, the ferroelectric 200 may be formed on the channel 110 and may constitute a gate stack with the gate electrode 300.

The ferroelectric 200 may have a negative capacitance in a specific operation region, and thus a sub-threshold swing (SS) may be lowered by applying the ferroelectric 200 to the gate stack.

The ferroelectric 200 may include one or two or more materials selected from the group consisting of hafnium oxide ($HfO_2$), zirconium oxide ($ZrO_2$), $Hf_xZr_{1-x}O_2$ (0<x<1), and combinations thereof. Such metal oxides may exhibit ferroelectricity even in a significantly thin film having a thickness of several nanometers, may be applied to existing silicon-based semiconductor device processes, and thus have high mass-productivity.

The ferroelectric 200 may include, as a base material, one or more materials selected from the group consisting of hafnium oxide ($HfO_2$), zirconium oxide ($ZrO_2$), hafnium-zirconium oxide ($Hf_xZr_{1-x}O$, 0<x<1), and combinations thereof, and may further include one or more dopant materials selected from the group consisting of C, Si, Ge, Sn, Pb, Al, Y, La, Gd, Mg, Ca, Sr Ba, Ti, Zr, Hf, and combinations thereof. The content of the dopant material may be greater than 0 at %, 0.2 at % or more, 0.5 at % or more, 1 at % or more, 2 at % or more, 3 at % or more, 10 at % or less, 8 at % or less, 7 at % or less, or 6 at % or less, with respect to the metal elements of the base material.

In addition, the ferroelectric 200 may include an orthorhombic crystal phase. For example, the ferroelectric 200 may include various crystal phases such as an orthorhombic crystal phase, a tetragonal crystal phase, or the like, but may include an orthorhombic crystal phase as a dominant crystal phase or in the largest amount among all crystal phases.

The ferroelectric 200 may be distinguished from high-k dielectric materials in the presence and/or size of remanent polarization, the composition of a metal oxide, the type and ratio of a doping element, a crystal phase, and the like. The type and content of each element may be measured by performing a method known in the art, and, for example, X-ray photoelectron spectroscopy (XPS), Auger electron spectroscopy (AES), inductively coupled plasma (ICP), etc. may be used. In addition, a crystal phase distribution may be obtained by performing a method known in the art, and, for example, transmission electron microscopy (TEM), grazing incidence X-ray diffraction (GIXRD), etc. may be used.

The ferroelectric 200 may have a thickness of greater than 0 and less than or equal to 20 nm. For example, the thickness of the ferroelectric 200 may be greater than 0 nm and 0.1 nm or greater, 0.2 nm or greater, 0.3 nm or greater, 0.4 nm or greater, 0.5 nm or greater, 0.6 nm or greater, 0.7 nm or greater, 0.8 nm or greater, 1.0 nm or greater, 1.5 nm or greater, 20 nm or less, 18 nm or less, 15 nm or less, 12 nm or less, 10 nm or less, 8 nm or less, 6 nm or less, 5 nm or less, 4 nm or less, 3 nm or less, 2 nm or less, or 1 nm or less. The thickness may be measured by performing a method known in the art. For example, ellipsometry (e.g., SE MG-1000 by Nano-View), etc. may be used to measure the thickness of the ferroelectric 200.

In a semiconductor device D20 of FIG. 2, a substrate 105 (hereinafter, also referred to as the silicon-on-insulator (SOI) substrate 105) may be an SOI substrate. The substrate 105 may include a lower silicon layer 10, a silicon oxide layer 20, and an upper silicon layer 30, and the source 120, the drain 130, and the channel 110 may be formed in the upper silicon layer 30.

The source 120 and the drain 130 may include a substrate material as a base material, and may be formed by injecting different impurities into different regions of the substrate 100. One of the source 120 and the drain 130 may be formed by injecting an n-type doping material, and the other may be formed by injecting a p-type doping material. The n-type doping material may be a group V element, and may include phosphorus (P), and/or arsenic (As). The p-type doping material may be a group III element and may include boron (B), aluminum (Al), indium (In), and/or gallium (Ga). The concentration of the doping materials of the source 120 and the drain 130 may be independently greater than $1 \times 10^{19}/cm^3$.

A region (e.g., the channel 110) between the source 120 and the drain 130 may not include a doping material and may not have a polarity. Alternatively, the region (e.g., the channel 110) between the source 120 and the drain 130 may have an n-type or p-type polarity. In this case, the region (e.g., the channel 110) between the source 120 and the drain 130 may have a concentration of the doping material lower than that of the source 120 or the drain 130 which has the same polarity. For example, the region (e.g., the channel 110) between the source 120 and the drain 130 may be n-type doped, and the concentration of the doping material may be $1 \times 10^{19}/cm^3$ or less.

As described above, the ferroelectric 200 included in the semiconductor devices D10 and D20 may be a substance in which polarization remains semi-permanent even after a voltage applied to the substance reaches 0 V, and the polarity (direction) of such remanent polarization may depend on the polarity (direction) of the voltage applied from the outside. By using such characteristics, a semiconductor device having non-volatile memory characteristics may be implemented. For example, the direction of the remanent polarization of the ferroelectric 200 may be changed by adjusting the direction of an external electric field applied to the ferroelectric 200 by 180°. In other words, the semiconductor device may be implemented such that the ferroelectric has remanent polarization corresponding to a low logic value (information "0") or a high logic value (information "1") while a positive voltage or a negative voltage is applied to the gate electrode. In addition, because of such direction of polarization of the ferroelectric, a difference in conductance may occur between the source and the drain, and thus information "0" or information "1" may be written or read. Information "0" and information "1" may correspond to programming and erase.

However, there may be a difference in the time taken to write and read information "0" and information "1" of the semiconductor device, depending on the polarity (direction) of the applied voltage. Such a difference in write speed between information "0" and information "1" may be more noticeable in the case where an SOI substrate is used as illustrated in FIG. 2 and thus the thickness of the channel is low, and the channel is floated by an insulating layer.

Figure 3A:
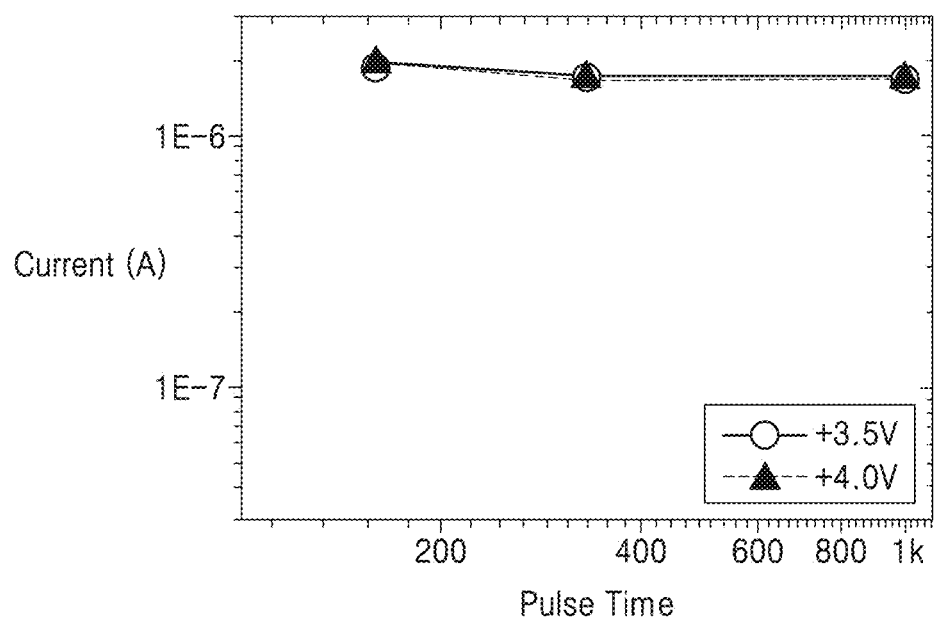
FIGS. 3A and 3B are graphs showing current values according to an applied voltage, with respect to a ferroelectric semiconductor device having an nMOS configuration according to a comparative example.
Figure 3B:
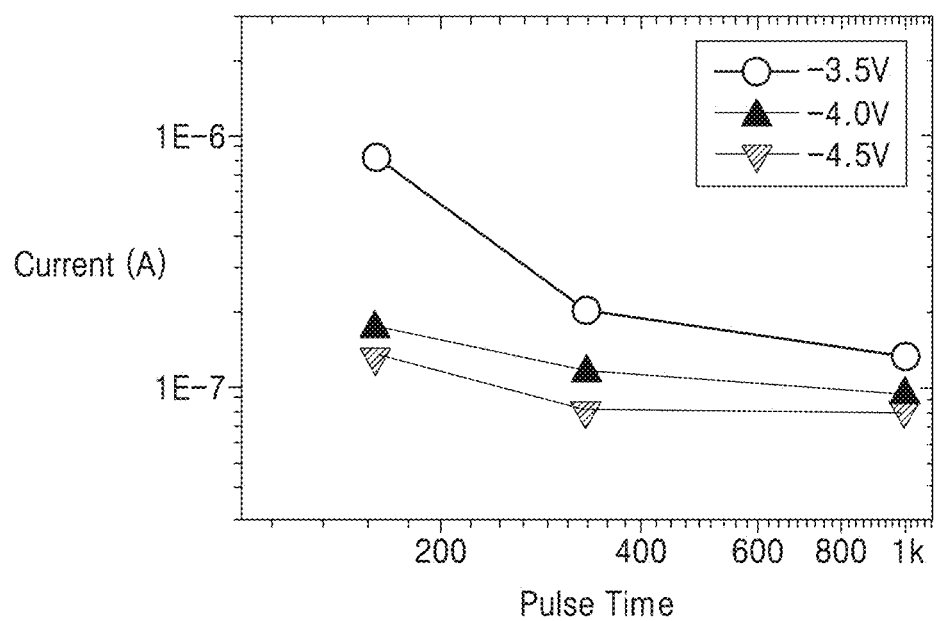

FIGS. 3A and 3B are graphs showing changes in current values over time with different directions (polarities) of a gate voltage in a semiconductor device according to a comparative example. The semiconductor device of the comparative example is an nMOS semiconductor device fabricated using an SOI substrate and equal n-type doping in the source and drain. The graphs show changes in current values over application time when external voltages with different directions (polarities) are applied to the semiconductor device. Referring to FIG. 3A, when a positive voltage is applied to the gate electrode, the current may easily reach a value greater than or equal to an operating current (e.g., $1 \times 10^{-6}$ A or greater) even with a relatively short application time (pulse time), for example, 160 ns or less, whereas, referring to FIG. 3B, when a negative voltage is applied to the gate electrode, it is difficult for the current to reach a value less than or equal to the operating current (e.g., $1 \times 10^{-7}$ A or less) even with a long application time (pulse time), for example, 1000 ns or greater. It is estimated that such a difference in write speed between information "0" and information "1" is due to the fact that the moving speed of electrons and holes of the channel affects the polarization of the ferroelectric.

In the semiconductor devices D10 and D20 according to an embodiment, as described above, the source 120 and the drain 130 may have different polarities. The different polarities of the source 120 and the drain 130 may help increase the polarization of the ferroelectric by easily and quickly providing the channel with electrons and holes required for writing information "0" and information "1".

Figure 4A:
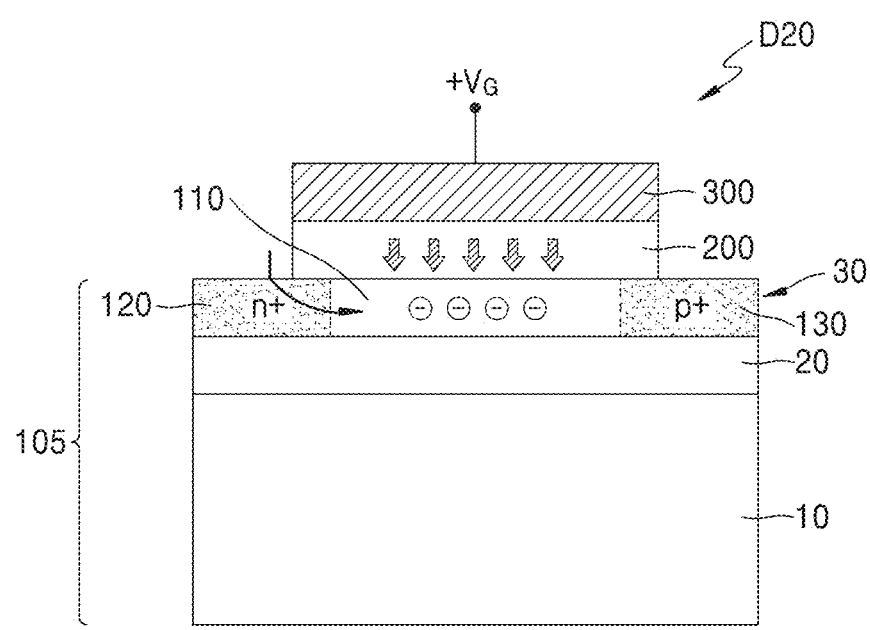
FIGS. 4A and 4B are diagrams conceptually illustrating electrical behaviors when voltages having different polarities are applied to a gate electrode of the semiconductor device of FIG. 2.
Figure 4B:
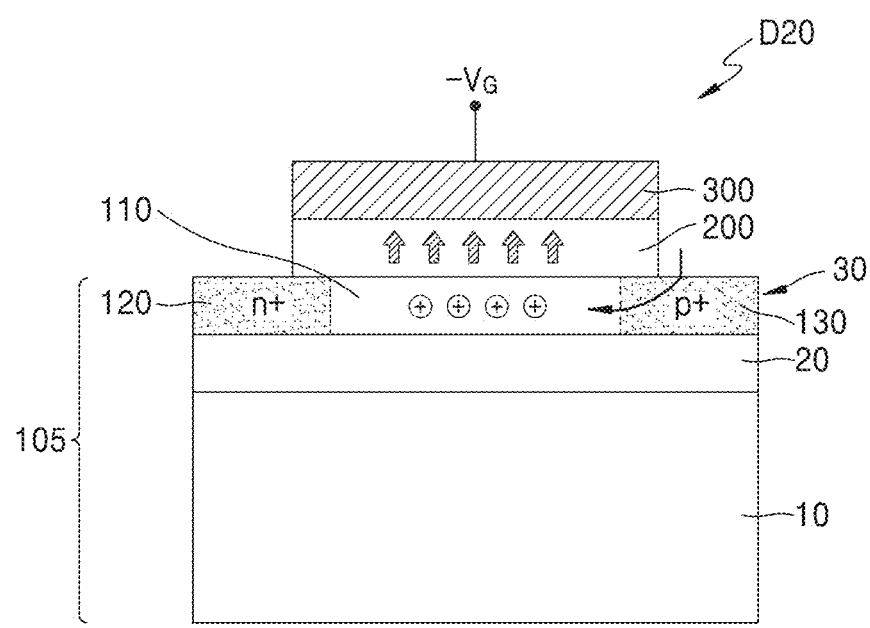

In the semiconductor devices D10 and D20 according to an embodiment, symmetry of electrical behaviors that induce a change in the polarization of the ferroelectric 200 when voltages of different signs are applied to the gate electrode 300 may be improved, and accordingly, improved performance may be expected when the semiconductor devices D10 and D20 are applied to, for example, a synapse device. FIGS. 4A and 4B are diagrams conceptually illustrating electrical behaviors when voltages having different polarities are applied to the gate electrode 300 of the semiconductor device 20 of FIG. 2.

As illustrated in FIG. 4A, when a voltage of $+V_G$ is applied to the gate electrode 300, electrons serving as carriers move from the source 120 that is highly n-type doped to the channel 110, and the polarization of the ferroelectric 200 is directed downward. As illustrated in FIG. 4B, when a voltage of $-V_G$ is applied to the gate electrode 300, holes serving as carriers move from the drain 130 that is highly p-type doped to the channel 110, and the direction of the polarization of the ferroelectric 200 changed by 180° to be directed upward.

As described above, when the direction of the polarization of the ferroelectric 200 is changed according to the voltage applied to the gate electrode 300, the electrical path through which carriers are provided to the channel 110 is symmetric, e.g., the switching symmetry with respect to $+V_G$ and $-V_G$ may be improved, and the switching speed may be improved.

Hereinafter, semiconductor devices according to various embodiments will be described.

Figure 5:
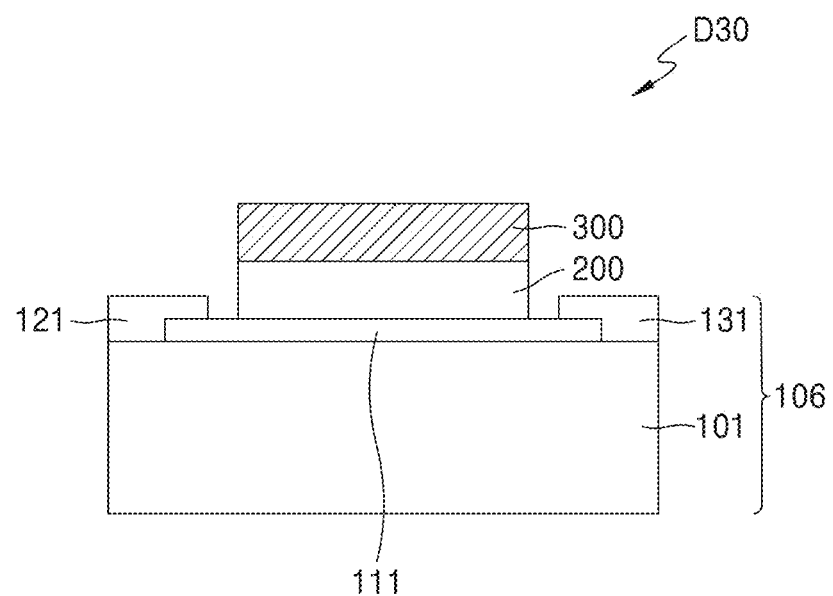
FIGS. 5 to 8 are schematic diagrams illustrating semiconductor devices, according to other embodiments.
Figure 6:
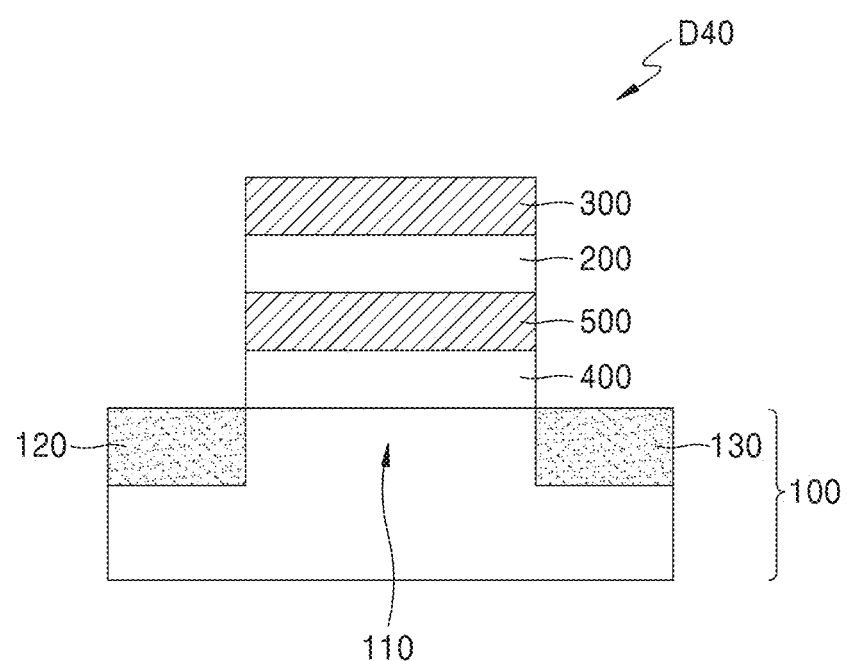

Referring to FIG. 5, a substrate 106 of a semiconductor device D30 includes a substrate region 101, a channel 111, a source 121, and a drain 131, and the channel 111 may be implemented as a material layer (a thin film) separate from the substrate region 101. In addition, each of the source 121 and the drain 131 may be implemented as a material layer separate from the substrate region 101. The material composition of the channel 111 may vary. For example, the channel 111 may include, in addition to a semiconductor material such as Si, Ge, SiGe, or a group III-V material, one or more selected from the group consisting of an oxide semiconductor, a nitride semiconductor, an oxynitride semiconductor, a two-dimensional (2D) material, a quantum dot, an organic semiconductor, and combinations thereof. For example, the oxide semiconductor may include InGaZnO or the like, the 2D material may include transition metal dichalcogenide (TMD) or graphene, and the quantum dot may include a colloidal quantum dot, a nanocrystal structure, or the like. In addition, the source 121 and the drain 131 may be formed of a conductive material, and may independently include, for example, a metal, a metal compound, or a conductive polymer. Referring to FIG. 6, a semiconductor device D40 may further include a dielectric layer 400 between the channel 110 and the ferroelectric 200. The dielectric layer 400 may suppress or prevent electrical leakage. The thickness of the dielectric layer 400 may be 0.1 nm or greater, 0.3 nm or greater, or 0.5 nm or greater, and may be 5 nm or less, 4 nm or less, 3 nm or less, 2 nm or less, or 1 nm or less. The dielectric layer 400 may include a paraelectric material or a high-k dielectric material, and may include silicon oxide, silicon nitride, aluminum oxide, hafnium oxide, zirconium oxide, or the like, or may include a 2D insulator such as hexagonal boron nitride (h-BN). For example, the dielectric layer 400 may include silicon oxide ($SiO_2$), silicon nitride ($SiN_x$), etc. In addition, the dielectric layer 400 may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), etc. In addition, the dielectric layer 400 may include a metal nitride oxide such as aluminum oxynitride (AlON), zirconium oxynitride (ZrON), hafnium oxynitride (HfON), lanthanum oxynitride (LaON), and yttrium oxynitride (YON), a silicate such as ZrSiON, HfSiON, YSiON, and LaSiON, or an aluminate such as ZrAlON and HfAlON.

In addition, a conductive layer 500 may be further included between the channel 110 and the ferroelectric 200. The conductive layer 500 may have a conductivity of about 1 Mohm/square or less. The conductive layer 500 may be a floating electrode and may be formed of a metal or a metal compound.

Figure 2:
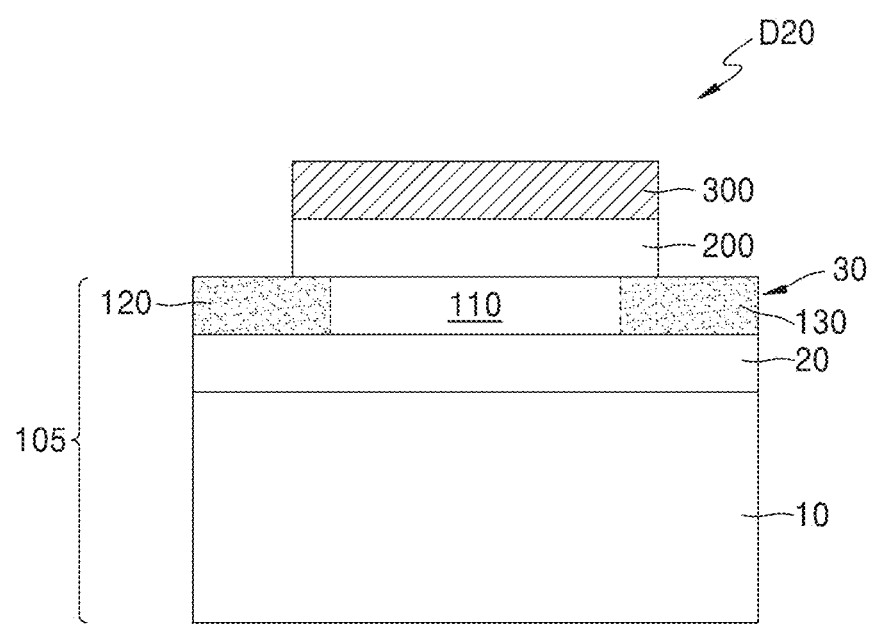
Figure 7:
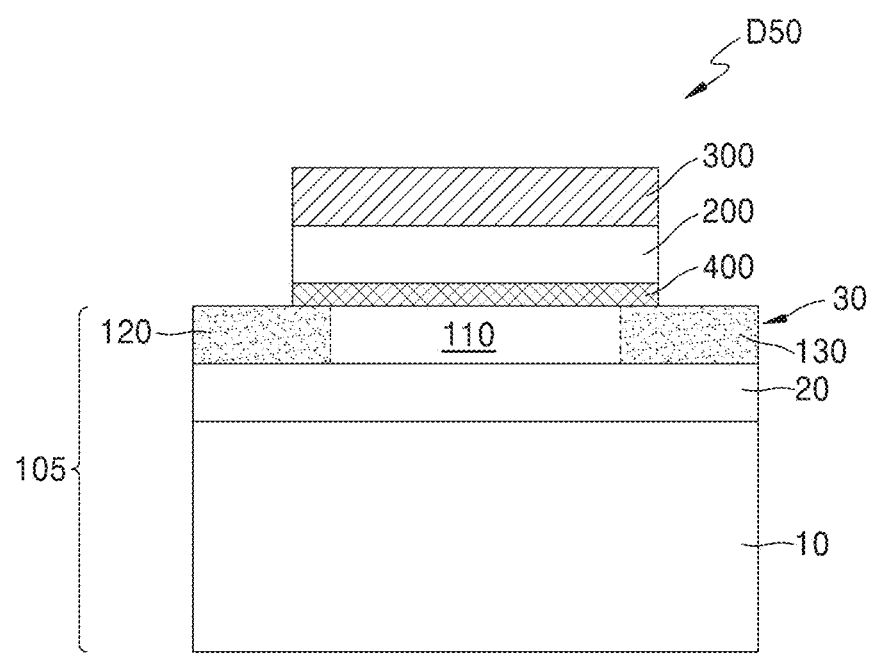

Referring to FIG. 7, a semiconductor device D50 is similar to the embodiment of FIG. 2 in that the source 120, the channel 110, and the drain 130 are formed in the SOI substrate 105, and the dielectric layer 400 for limiting and/or preventing electrical leakage is further provided between the channel 110 and the ferroelectric 200.

Figure 8:
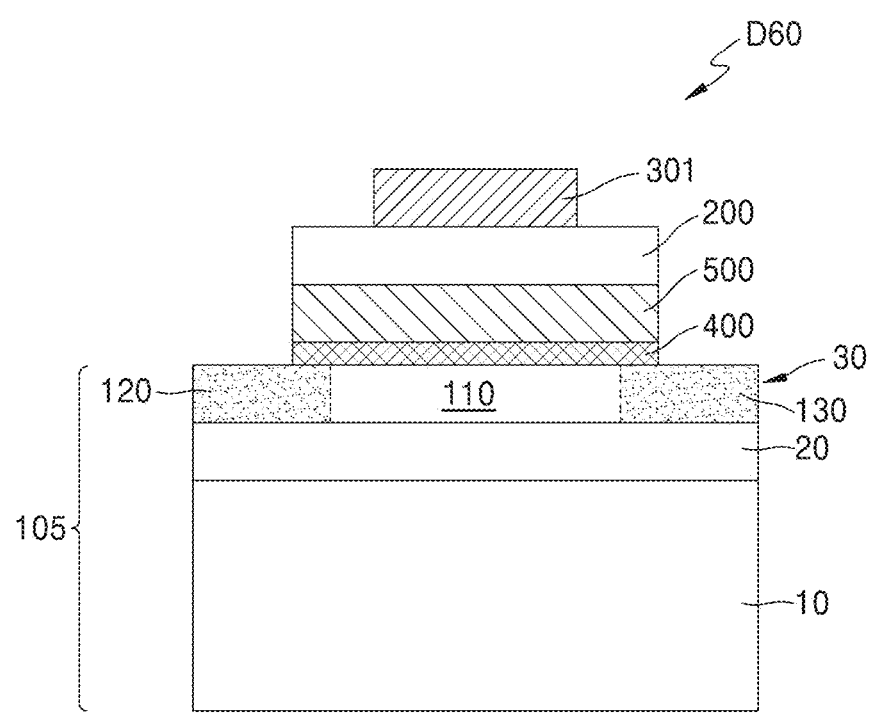

Referring to FIG. 8, a semiconductor device D60 is different from the semiconductor device D20 of FIG. 2 in that the conductive layer 500 and the dielectric layer 400 are further provided between the channel 110 and the ferroelectric 200. The conductive layer 500 may function as a floating gate. A gate electrode 301 and the conductive layer 500 have different cross-sectional areas facing the channel 110. As illustrated, the dielectric layer 400, the conductive layer 500, and the ferroelectric 200 may have the same width, and the gate electrode 301 may have a narrower width. Accordingly, an electric field applied to the dielectric layer 400 may be reduced, and the endurance may be improved.

A programming time and/or an erase time may be adjusted to a desired level according to the field to which the semiconductor device is applied. For example, both the programming time and the erase time may be 1200 ns or less, and, when applied to neuromorphic engineering, both the programming time and the erase time may be 10 us or less. Programming, erase, information "0", and information "1" may be defined according to a desired operation level, and a voltage, a current value, and the like are not limited. For example, in the state of programming or information "1", a current, which is two times or more, three times or more, five times or more, ten times or more, or fifteen times or more than in the state of erase or information "0", is flowing.

In the semiconductor devices D10, D20, D30, D40, D50, and D60 according to embodiments, the memory switching time according to a change in polarity of an applied voltage may be short. For example, the ratio of the erase time to the programming time may be 0.8 or greater, 0.9 or greater, 1.0 or greater, 1.2 or greater, 5.0 or less, 4.5 or less, 4.0 or less, 3.5 or less, or 3.0 or less. In other words, the ratio of the write time of information "1" to the write time of information "0" may be 0.8 or greater, 0.9 or greater, 1.0 or greater, 1.2 or greater, 5.0 or less, 4.5 or less, 4.0 or less, 3.5 or less, or 3.0 or less. The ratio of the erase time to the programming time may be determined by alternately applying voltages having different polarities (directions), and the magnitudes of the applied voltages in positive and negative directions may be equal to or different from each other.

In the semiconductor devices D10, D20, D30, D40, D50, and D60 according to embodiments, the ratio of the erase time to the programming time may be close to 1. As described above, the difference in write speed between information "0" and information "1" may be based on a difference in speed at which electrons or holes are supplied to the channel. However, in the case of the embodiment, because paths through which electrons or holes are supplied to the channel are substantially symmetrical and substantially electrically identical to each other, there may be little difference in write speed. For example, the ratio of the erase time to the programming time may be in a range of about 0.8 to about 1.2.

The semiconductor devices D10, D20, D30, D40, D50, and D60 may be implemented in various forms such as 2-dimension, 3-dimension, and the like. For example, the semiconductor devices D10, D20, D30, D40, D50, and D60 may have a 1-gate-on-channel configuration such as a planar field-effect transistor (FET), a 3-gate-on-channel configuration such as a Fin-FET, or a 4-gate-on-channel configuration such as a gate-all-around-FET.

Figure 9A:
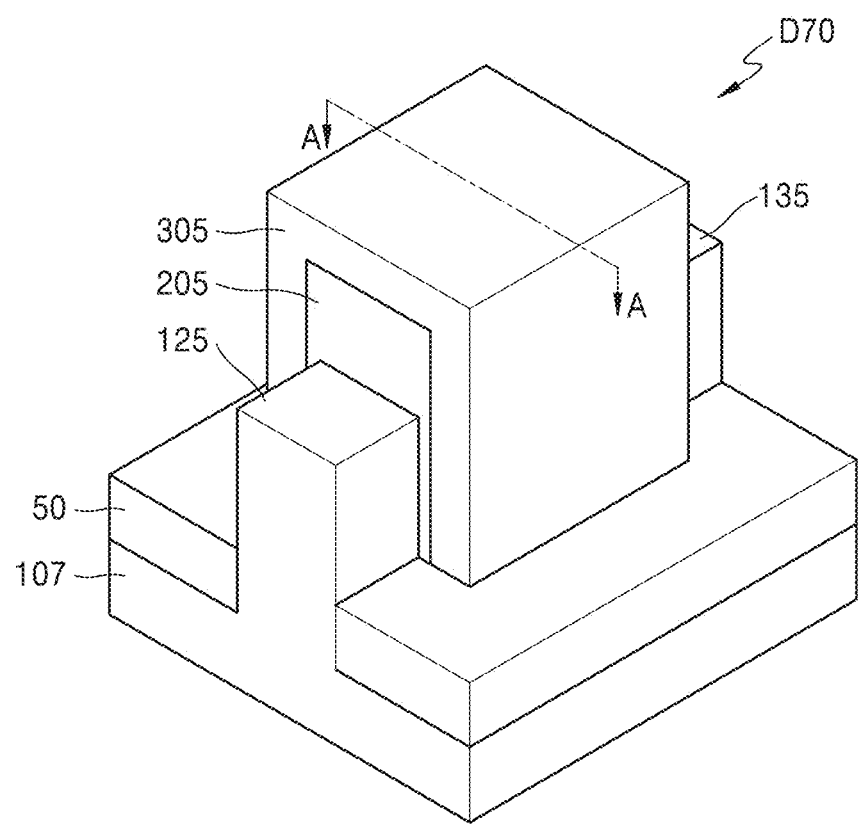
FIGS. 9A and 9B are schematic diagrams illustrating a semiconductor device (a field-effect transistor), according to another embodiment.
Figure 9B:
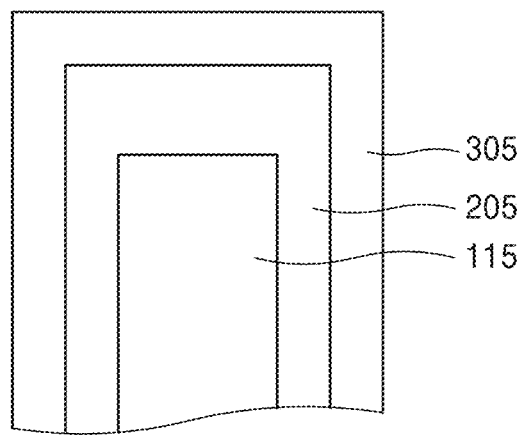

FIGS. 9A and 9B are schematic diagrams illustrating a semiconductor device D70 (hereinafter, also referred to as the Fin-FET D70) (e.g., a Fin-FET) according to another embodiment. FIG. 9B is a cross-sectional view taken along line AA of FIG. 9A.

Referring to FIGS. 9A and 9B, the Fin-FET D70 may include a source 125, a drain 135, and a channel 115 defined as a region therebetween, and the channel 115 may have a shape of a fin. The channel 115 may include a material applied to the channel 110 or the channel 111 described above. A gate electrode 305 may be on a substrate 107 having the shape of a fin to intersect the shape of a fin. The channel 115 may be formed in a region where the shape of a fin intersects the gate electrode 305. A ferroelectric 205 may be between the channel 115 and the gate electrode 305 to surround the channel 115. An insulating layer 50 may be on the substrate 107 to insulate the gate electrode 305 from the substrate 107.

Figure 10A:
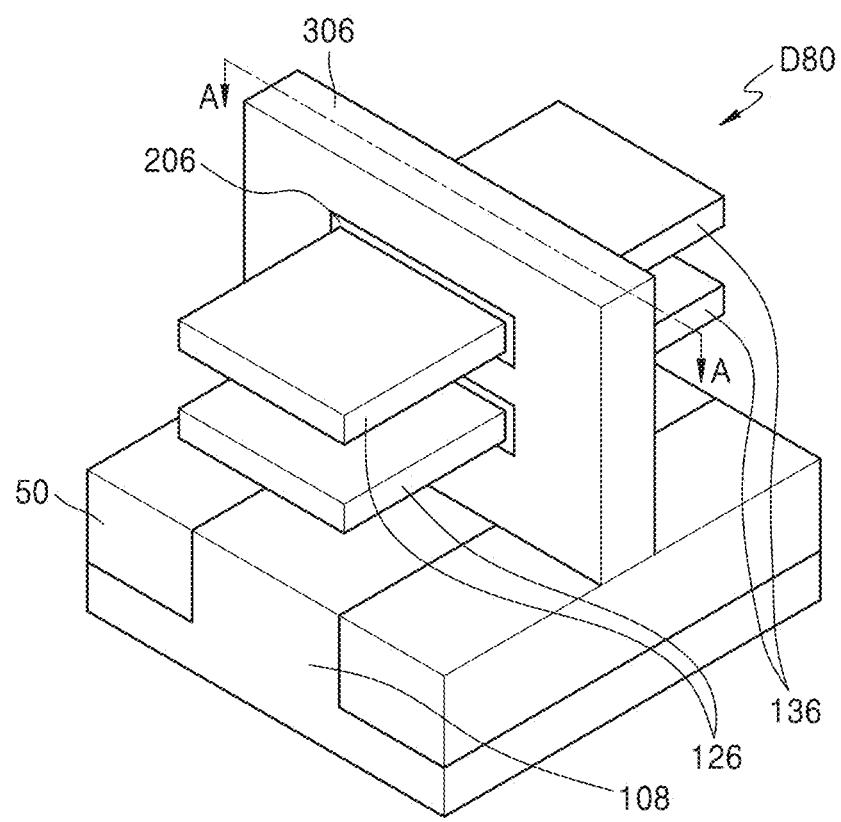
FIGS. 10A and 10B are schematic diagrams illustrating a semiconductor device (a field-effect transistor), according to another embodiment.
Figure 10B:
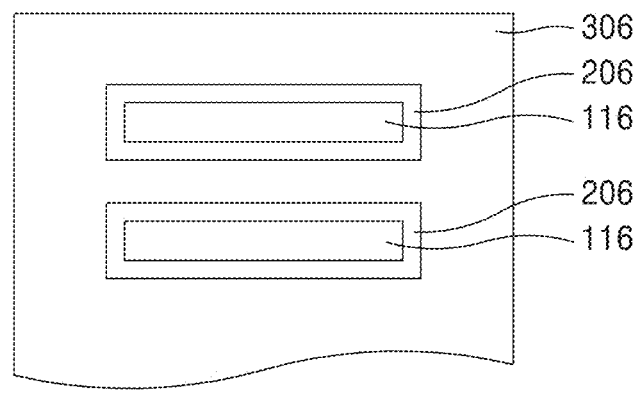

FIGS. 10A and 10B are schematic diagrams illustrating a semiconductor device D80 (hereinafter, also referred to as the gate-all-around-FET D80) (e.g., a gate-all-around-FET) according to another embodiment. FIG. 10B is a cross-sectional view taken along line AA of FIG. 10A. Referring to FIGS. 10A and 10B the gate-all-around-FET D80 includes sources 126, drains 136, and channels 116 defined as regions between each of the sources 126 and the drains 136. The channel 116 may have the shape of a wire, a sheet, or the like, and may include a material applied to the channel 110 or the channel 111 described above. The sources 126, the drains 136, and the channels 116 may be spaced apart from a substrate region 108. A gate electrode 306 may intersect the sources 126, the drains 136, and the channels 116 and surround them. The channel 116 may be formed in a region surrounded by the gate electrode 306. For example, a ferroelectric 206 may be between the channel 116 and the gate electrode 306 to surround the channel 116.

Figure 11A:
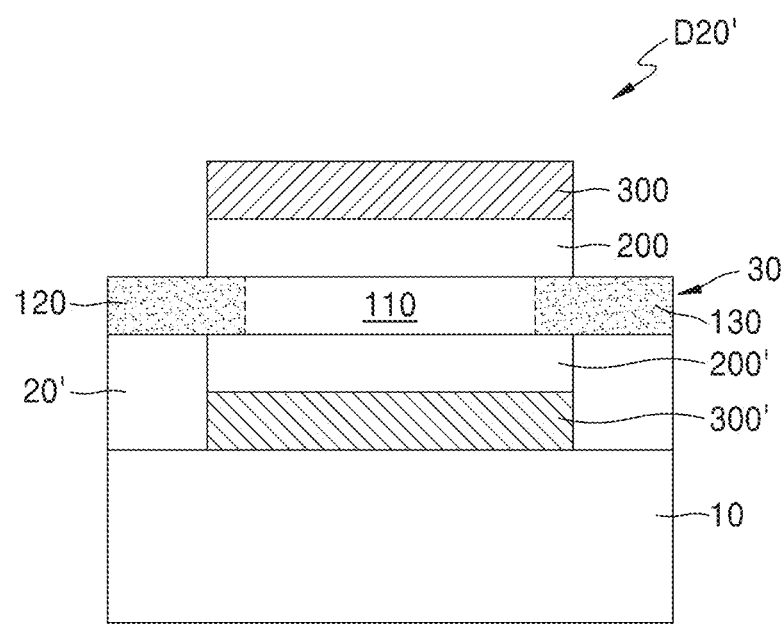
FIGS. 11A and 11B are schematic diagrams illustrating semiconductor devices, according to other embodiments.

Also, some semiconductor devices according to example embodiments may be modified to provide dual-gate devices. For example, as depicted in FIG. 11A, the semiconductor device 20 described above in FIG. 2 may be modified to provide a dual-gate device 20'. The dual-gate device may include a bottom gate electrode 300' on the silicon layer 10 and a bottom ferroelectric 200' on the bottom gate electrode 300' below the channel 110. A silicon oxide layer 20' may surround sidewalls of the bottom gate electrode 300' and the bottom ferroelectric 200'. The source 120 and drain 130 may be formed on the silicon oxide layer 20' and extend partially over the bottom ferroelectric 200'.

The bottom ferroelectric 200' may be formed of the same materials described above that are suitable for the ferroelectric 200. The bottom gate electrode 300' may be may be formed of the same materials described above that are suitable for the gate electrode 300.

Figure 11B:
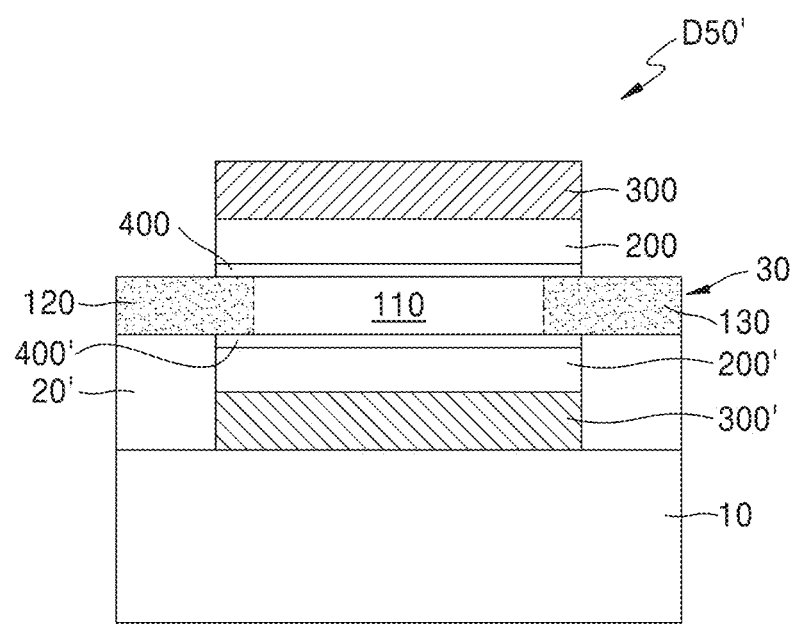

Referring to FIG. 11B, a dual-gate device D50' may be the same as the dual-gate device D20' in FIG. 11A, except for further including a dielectric layer 400 between the channel 110 and the ferroelectric 200' and/or a dielectric layer 400' between the channel 110 and the bottom ferroelectric 200'. Although not illustrated in FIG. 11B, a conductive layer 500 may be provided between the channel 110 and ferroelectric 200 and a conductive layer may be provided between the channel 110 and the bottom ferroelectric 200'.

Optionally the ferroelectric 200 and gate electrode 300 in the devices D20' and D50' shown in FIGS. 11A and 11B may be omitted to provide bottom-gate devices.

The semiconductor device may be applied as a logic device or a memory device in various electronic devices. The semiconductor device according to embodiments may operate with low power consumption, and thus may meet requirements for miniaturization and integration of an electronic device. For example, the semiconductor device and a semiconductor apparatus including the same may be used for arithmetic operations, program execution, temporary data retention, and the like in an electronic device such as a mobile device, a computer, a notebook computer, a sensor, a network device, a neuromorphic device, and the like. The semiconductor device and the semiconductor apparatus according to embodiments may be useful for an electronic device that continuously performs a large amount of data transmission.

Figure 12:
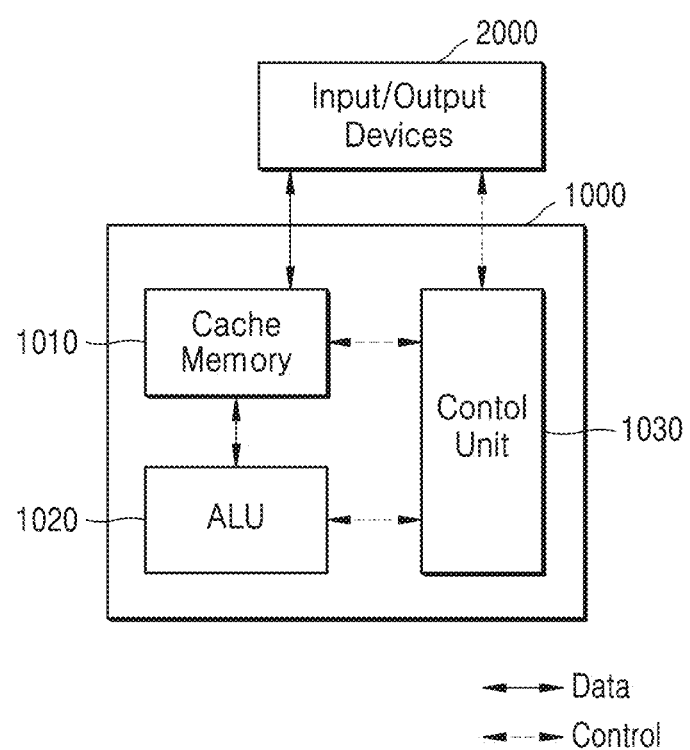
FIGS. 12 and 13 are conceptual diagrams schematically illustrating a device architecture that may be applied to an electronic device, according to an embodiment.
Figure 13:
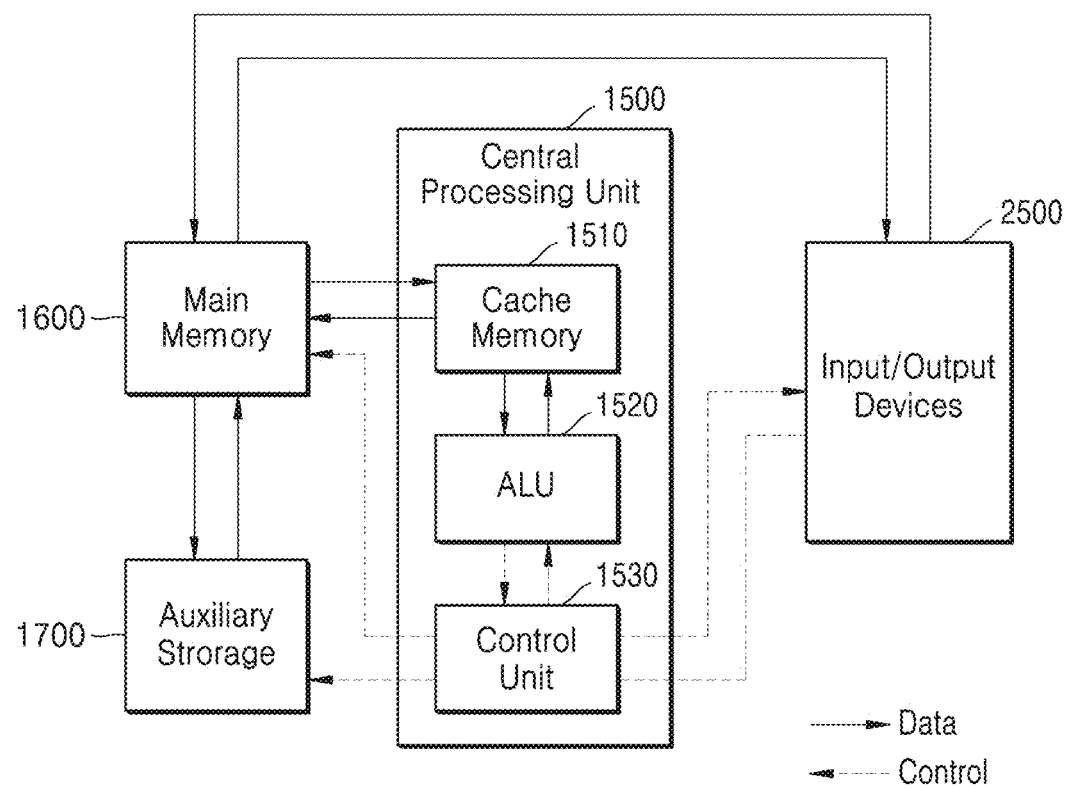

FIGS. 12 and 13 are conceptual diagrams schematically illustrating an electronic device architecture 1000 that may be applied to an electronic device, according to an embodiment.

Referring to FIG. 12, the electronic device architecture 1000 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1000 may be implemented as one chip including the memory unit 1010, the ALU 1020, and the control unit 1030. For example, the memory unit 1010, the ALU 1020, and the control unit 1030 may be connected to each other via metal lines in an on-chip manner, to directly communicate with each other. The memory unit 1010, the ALU 1020, and the control unit 1030 may be monolithically integrated on one substrate to constitute one chip. Input/output devices 2000 may be connected to the electronic device architecture (chip) 1000.

The memory unit 1010, the ALU 1020 and/or the control unit 1030 may independently include any one of the semiconductor devices D10, D20, D20', D30, D40, D50, D50', D60, D70, and D80 described above. The electronic device architecture (chip) 1000 may be an on-chip memory processing unit.

Referring to FIG. 13, a cache memory 1510, an ALU 1520, and a control unit 1530 may constitute a central processing unit (CPU) 1500. The cache memory 1510 may include the semiconductor device described above. A main memory 1600 and an auxiliary storage 1700 may be provided separately from the CPU 1500. The main memory 1600 may include any one of the semiconductor devices D10, D20, D20', D30, D40, D50, D50', D60, D70, and D80 described above.

In some cases, the electronic device architecture may be implemented in such a manner that computing unit devices and memory unit devices are adjacent to each other in one chip without distinguishing sub-units.

The semiconductor device described above may be fabricated by performing a method known in the art, except that forming a source and a drain by injecting a p-type doping material and a n-type doping material into different regions of a substrate, respectively.

The ferroelectric may be prepared by forming an amorphous layer having a desired composition on a substrate by performing a method known in the art, and annealing the amorphous layer. For example, the amorphous layer may be formed by performing deposition methods such as atomic layer deposition (ALD), chemical vapor deposition (CVD), physical vapor deposition (PVD), sputtering, and the like. Among them, an ALD method is advantageous in that a layer may be formed to be uniform in an atom level and it may be performed at a relatively low temperature.

When forming the ferroelectric by performing an ALD method, a general precursor known in the art may be used as a hafnium source, a zirconium source, and an oxygen source. For example, the hafnium source may be at least one selected from the group consisting of $Hf(OtBu)_4$, tetrakis ethyl methyl amino hafnium TEMAH, tetrakis dimethyl amino hafnium (TDMAH), tetrakis diethyl amino hafnium (TDEAH), and combinations thereof, but is not limited thereto. In addition, the zirconium source may be at least one selected from the group consisting of $Zr(OtBu)_4$, tetrakis ethyl methyl amino zirconium (TEMAZ), tetrakis dimethyl amino zirconium (TDMAZ), tetrakis diethyl amino zirconium (TDEAZ), and combinations thereof, but is not limited thereto. In addition, the oxygen source may be at least one selected from the group consisting of $O_3$, $H_2O$, $O_2$, $N_2O$, $O_2$ plasma, and combinations thereof, but is not limited thereto.

The amorphous layer may be crystallized by annealing, and then form the ferroelectric. The annealing may be performed under conditions suitable for causing the amorphous layer to be transformed into a ferroelectric including an orthorhombic crystal phase.

For example, the annealing may be performed at a temperature of about 400° C. to about 1100° C., but is not limited thereto. The annealing may be performed for a time of 1 nano-second or longer, 1 micro-second or longer, 0.001 second or longer, 0.01 second or longer, 0.05 second or longer, 0.1 second or longer, 0.5 second or longer, 1 second or longer, 3 seconds or longer, or 5 seconds or longer, and 10 minutes or shorter, 5 minutes or shorter, 1 minute or shorter, or 30 seconds or shorter, but is not limited thereto.

The gate electrode may be formed on the amorphous layer before the amorphous layer is annealed, or may be formed on the ferroelectric after the amorphous layer is annealed.

A ferroelectric semiconductor device having excellent memory switching characteristics may be provided. A ferroelectric semiconductor device having a small difference between the programming time and the erase time may be provided. A ferroelectric semiconductor device including a source and a drain having different polarities may be provided. The semiconductor device may be applied to various electronic devices, electronic apparatuses, electronic circuits, and the like.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device comprising:
   a substrate including a source, a drain, and a channel between the source and the drain;
   a gate electrode above the substrate; and
   a ferroelectric between the substrate and the gate electrode,
   wherein the source and the drain are doped to have different polarities from each other, the ferroelectric comprises a base material and a dopant material, the base material includes one or more selected from the group consisting of zirconium oxide ($ZrO_2$), hafnium oxide ($HfO_2$), and hafnium-zirconium oxide ($Hf_xZr_{1-x}O$, $0<x<1$), the dopant material comprises one or more materials selected from the group consisting of C, Si, Ge, Sn, Pb, Al, Y, La, Gd, Mg, Ca, Sr Ba, Ti, Zr, and Hf, a content of the dopant material of the ferroelectric is greater than 0 at % and less than or equal to 6 at %, with respect to metal elements of the base material, and a thickness of the ferroelectric is greater than 0 nm and less than or equal to about 20 nm.

2. The semiconductor device of claim 1,
wherein a ratio of an erase time to a programming time of the semiconductor device is about 0.8 to about 5.0.

3. The semiconductor device of claim 1,
wherein a programming time of the semiconductor device and an erase time of the semiconductor device are each 1,200 ns or less.

4. The semiconductor device of claim 1,
wherein the ferroelectric comprises an orthorhombic crystal phase.

5. The semiconductor device of claim 1,
wherein the substrate comprises one or more selected from the group consisting of Si, Ge, SiGe, and a group III-V semiconductor.

6. The semiconductor device of claim 1,
wherein the substrate is a silicon-on-insulator (SOI) substrate including a lower silicon layer, a silicon oxide layer, and an upper silicon layer, and
the source, the drain, and the channel are in the upper silicon layer.

7. The semiconductor device of claim 6, further comprising:
a dielectric layer between the substrate and the ferroelectric.

8. The semiconductor device of claim 7, further comprising:
a conductive layer between the dielectric layer and the ferroelectric, wherein
a cross-sectional area of the gate electrode is less than a cross-sectional area of the conductive layer.

9. The semiconductor device of claim 1,
wherein the channel comprises a semiconductor material different from a semiconductor material of the substrate.

10. The semiconductor device of claim 1,
wherein the channel comprises one or more selected from the group consisting of Si, Ge, SiGe, a group III-V material, an oxide semiconductor, a nitride semiconductor, an oxynitride semiconductor, a two-dimensional (2D) material, a quantum dot, and an organic semiconductor.

11. The semiconductor device of claim 1, further comprising:
a dielectric layer between the substrate and the ferroelectric.

12. The semiconductor device of claim 11,
wherein the dielectric layer comprises a paraelectric material or a high-k dielectric material.

13. The semiconductor device of claim 11,
wherein the dielectric layer comprises one or more selected from the group consisting of aluminum oxide ($Al_2O_3$), lanthanum oxide ($La_2O_3$), yttrium oxide ($Y_2O_3$), silicon oxide ($SiO_2$).

14. The semiconductor device of claim 11, further comprising:
a conductive layer between the substrate and the ferroelectric.

15. The semiconductor device of claim 1, wherein a region of the substrate between the source and the drain does not comprise a doping material.

16. The semiconductor device of claim 1, wherein
a region of the substrate between the source and the drain is doped to have a same polarity as a polarity of the source or the drain, and
a concentration of a doping material in the region of the substrate between the source and the drain is less than a dopant concentration the source or a dopant concentration in the drain.

17. The semiconductor device of claim 16,
wherein the concentration of the doping material in the region between the source and the drain is $1\times10^{19}/cm^3$ or less.

18. The semiconductor device of claim 1,
wherein the semiconductor device has memory-like characteristics.

19. An electronic device comprising:
the semiconductor device of claim 1.

20. The semiconductor device of claim 1, wherein a width of the ferroelectric is greater than a width of the channel.

* * * * *